United States Patent [19]

Geldermans et al.

[11] Patent Number: 4,617,730

[45] Date of Patent: Oct. 21, 1986

[54] METHOD OF FABRICATING A CHIP INTERPOSER

[75] Inventors: Pieter Geldermans; Gangadhara S. Mathad, both of Poughkeepsie, N.Y.

[73] Assignee: International Business Machines Corporation, Armonk, N.Y.

[21] Appl. No.: 639,988

[22] Filed: Aug. 13, 1984

[51] Int. Cl.⁴ .............................................. H01R 4/00
[52] U.S. Cl. .................................... 29/843; 29/853; 174/68.5; 357/71; 427/97
[58] Field of Search ............... 156/643, 644; 174/68.5; 29/840, 852, 853; 357/80, 71; 427/97

[56] References Cited

U.S. PATENT DOCUMENTS

| | | | |
|---|---|---|---|
| 4,047,290 | 9/1977 | Weitze et al. | 174/68.5 X |
| 4,074,342 | 2/1978 | Honn et al. | 361/411 |
| 4,202,007 | 5/1980 | Dougherty et al. | 174/68.5 X |
| 4,277,321 | 7/1981 | Bartlett et al. | 29/852 X |
| 4,349,862 | 9/1982 | Bajurek et al. | 174/68.5 X |
| 4,386,116 | 5/1983 | Nair et al. | 357/71 X |
| 4,439,270 | 3/1984 | Powell et al. | 357/71 X |
| 4,495,220 | 1/1985 | Wolf et al. | 156/644 X |
| 4,517,050 | 5/1985 | Johnson et al. | 29/853 X |

FOREIGN PATENT DOCUMENTS

| | | | |
|---|---|---|---|
| 981799 | 1/1976 | Canada | 357/71 R |
| 2132411 | 7/1984 | United Kingdom | 357/80 |

OTHER PUBLICATIONS

IBM Tech. Discl. Bull., vol. 14, No. 11, Apr. 1972, p. 3224 by Balderes et al.
IBM Tech. Discl. Bull., vol. 21, No. 11, Mar. 1979, p. 3974 by Funari et al.
IBM Tech. Discl. Bull., vol. 22, No. 1, Jun. 1979, p. 126 by Reith et al.
IBM Technical Disclosure Bulletin, vol. 18, No. 5, Oct. 1975, pp. 1440–1441, "Semiconductor Device Carrier for Modules", by M. T. McMahon, Jr.
IBM Technical Disclosure Bulletin, vol. 23, No. 9, Feb. 1981, pp. 4062–4063, "Pin/Chip Carrier Assembly", by S. M. Jensen et al.
IBM Technical Disclosure Bulletin, vol. 21, No. 2, Jul. 1978, pp. 498–499, "MLC Expander", Gow et al.
IBM Technical Disclosure Bulletin, vol. 24, No. 9, Feb. 1982, "Chip Carrier Interface with Signal Path Change Capability, p. 4637, Ecker et al.
IBM *Technical Disclosure Bull.*, vol. 13, No. 2, Jul. 1970, pp. 511–512 by Mutter et al.

*Primary Examiner*—Howard N. Goldberg
*Assistant Examiner*—Carl J. Arbes
*Attorney, Agent, or Firm*—John D. Crane; Anne V. Dougherty

[57] ABSTRACT

Disclosed is a method of fabricating a multichip interposer comprising an insulating support with thin film fine line metallization on one side thereof. A layer of masking material is adhered to in other side and selective areas of the masking material are removed in a desired pattern to expose areas of the support. The exposed areas of the support are then etched until the metallization is reached to form via holes which are subsequently filled with interconnecting metallurgy. Contact pads are then formed around each filled via hole.

29 Claims, 14 Drawing Figures

METHOD OF FABRICATING A CHIP INTERPOSER

BACKGROUND OF THE INVENTION

1. Field of the Invention

The present invention relates to interposers for integrated circuit chips and more particularly to a method for fabricating a chip interposer, starting with a substrate featuring many chip locations, to be subsequently diced into a plurality of chip interposers, which can each carry one or more chips.

2. Description of the Prior Art

It is well known that integrated circuit chips may be mounted onto a multilayer ceramic substrate (MLC) through small solder ball joints (known as C-4 joints), which are used to bond the chips to pads on the substrate.

In today's technology, the MLC substrate performs a number of electrical functions: it provides voltage planes, signal lines, ground planes and redistribution planes. Redistribution planes are a set of planes at the top part of the module, that translate the internal, wide, via grid of the MLC module, to the much tighter grid for the chip connections. The redistribution planes are the most difficult to make, since they contain a very dense via grid and very dense wiring. The redistribution planes are also a source of unwanted signal noise.

Future chips will not only require more connections between the chip and the MLC, but will also require connections on a denser grid than today's chips. This requirement makes it difficult to make MLC economically and it exacerbates the electrical noise problem, and causes yield problems since redistribution planes of grater complexity will be needed.

These problems could be alleviated, by placing the redistribution on top of the MLC using fine line wiring, also known as TFR (thin film redistribution). The fine line wiring consists of ground planes and wiring planes. The connection with the chips is made on top of the TFR, with the aid of terminal pads, which connect via holes at the upper surface of an MLC substrate. TFR depends on photolithography to make the patterns of features. TFR construction is detailed in various U.S. patents assigned to the assignee of the present invention, see for example, U.S. Pat. Nos. 3,726,002 and 3,968,193.

The MLC substrate, which will incorporate TFR, includes a multi-level metallization at a plurality of planes. Further, vertical conductive paths through the MLC layers forming the substrate are provided by a plurality of metal-filled vias.

The TFR structure basically comprises metallurgy located at different levels separated by a plurality of insulating (e.g. polyimide or glass) layers. Vertical interconnections between different levels of metallurgy are provided through via holes. In one implementation, the first level of metal is Chromium-copper-chromium (Cr-Cu-Cr) while the second level of metal is copper-chromium (Cu-Cr). An additional land of metal may be formed to permit the bonding of the chip solder balls.

Future substrates with TFR need to carry several chips. The size of the substrate will be in the range of approximately $6.5 \times 6.5$ cm$^2$ to approximately $20 \times 20$ cm$^2$, typically approximately $10 \times 10$ cm$^2$. The wiring requirements for TFR do not permit enough space for redundant lines. In other words, all lines on the TFR must be electrically sound if the substrate is to perform properly. If the substrate plus TFR are not electrically perfect, one has to either discard the (expensive) substrate or strip the TFR and begin the complex process all over again or engage in an equally expensive repair process, all of which are expensive alternatives. The processes required for economically making high yield, defect-free planes of fine line wiring over $10 \times 10$ cm$^2$, exceeds the capability of present and foreseen technologies.

To deal with this yield problem, a known approach has been to make the TFR on a simple, inexpensive, piece of ceramic which is separate from the MLC substrate. This ceramic would be built by the conventional techniques of punching, screening and laminating, containing only via connections from the front to the back.

This technique permits one to sort out the good sections of TFR and discard the bad ones. The good sections can then be attached to the MLC substrate.

To make the TFR sections economically (i.e., to reap the benefits of batch fabrication), one has to fabricate the TFR sections on large pieces of ceramic. The limitation to this batch fabrication, is the uncertainty about the precise location of the front-to-back vias. This uncertainty ensues from variations of firing shrinkage from substrate to substrate and within one substrate. As mentioned before, TFR is made with photolithography, which, to attain its fine line wiring capability, relies on precise location of all surface features to which it is to be aligned.

The article entitled "Semiconductor device carrier for Modules" authored by M. T. McMahon, published in the IBM Technical Disclosure Bulletin, Vol. 18, No. 5, pp 1440 and 1441 (ref.1) is a good example of the prior art, in that it proposes an interposer made by essentially the same technology as the main body of the MLC substrate: the interposer is made by casting green sheet, punching, screening the lines and firing. The described interposer does not contain a ground plane, so it cannot compete with TFR-like structure.

The publication mentioned above, uses conventional punching and screening techniques for making the interconnections, the so-called screened vias.

Punching and screening are known to be expensive steps not directly applicable to batch processing. Furthermore, there is an additional disadvantage, specific to single chip interposers, in terms of testability. Probing large areas, such as a multichip interposer which are made by photolithography, is more desirable because the chip positions are exactly in the right location.

As a consequence, multichip interposers or carriers have also been suggested in the prior art; see for example IBM Technical Disclosure Bulletin, Vol. 23, No. 9, Feb. 1981, pp. 4062–4063, an article entitled "Pin/chip Carrier Assembly" by S. M. Jensen et al. (ref.2). However, the multichip interposer which is described in this article is also made according to standard MLC technology. Therefore, most of the drawbacks mentioned above still remain. In particular, if any defect is found in the interposer, the whole part is to be discarded.

OBJECTS OF THE INVENTION

It is, therefore, a primary object of the present invention to provide a novel method of making multichip interposers including a TFR-like structure for a plurality of chips, independently of the MLC substrate, having a high manufacturing yield capability.

It is also a primary object of this invention to alleviate the problems related to the inherent variations in the shrinkage of ceramic material which has vias formed in it prior to the formation of TFR on its surface.

It is another object of the present invention to provide a novel method of making multichip interposers including a TFR-like structure for a plurality of chips which may be diced into single chip interposers, therefore, permitting selection of only good parts to be used as single interposers between the MLC substrate and the semiconductor chips, which in turn, results in higher yields for more complex packages.

It is still another object of the present invention to provide a novel method of making such interposers in which the step of forming the via holes is fully compatible with advanced photolithographic techniques therefore allowing more precise and dense designs.

It is still another object of the present invention to provide a novel method of making multichip interposers including a TFR-like structure where the latter is formed onto a flat, unprocessed insulating support.

It is still another object of the present invention to provide a novel method of making such interposers in which said step of forming via holes is accomplished through dry etching techniques such as plasma or laser etch, compatible with high throughput batch processing, which, in turn, results in lower manufacturing costs.

SUMMARY OF THE INVENTION

In accordance with the present invention, described is a method of fabricating a multichip interposer including a TFR-like structure formed onto an insulating support (i.e., a glass ceramic sheet) which is provided with a plurality of metallized via holes associated with contact pads, permitting not only the electrical connection between the two opposite sides of the support but also its attachment to a substrate. The support is subsequently diced, into single chip interposers which are sorted, and only good parts are used as interposers between the chips and the MLC substrate.

According to a first preferred embodiment of the present invention, thin film fine line metallization such as a TFR-like structure is deposited onto a sheet of ceramic (glass ceramics or standard ceramics) according to a desired pattern. After the TFR is deposited, vias are then formed as follows:

An appropriate masking material such as chromium is deposited onto the backside of the support to serve as a masking material for subsequent etching steps. A photoresist layer is then coated onto the chromium layer, exposed through a suitable mask and developed, to leave exposed those portions of the chromium layer where vias are to be formed. Exposed chromium is then removed. Next, a dry plasma etching process is used to form the vias in the support. The remaining portions of the photoresist layer are stripped. The vias are at least partially filled with an interconnecting metal (e.g., by blanket sputtering of copper on the backside of the support), whereby the electrical connection between the top and bottom side of the support is completed. Unwanted portions of copper (and underlying chromium) are then removed using standard photolithographic and etching steps. The electrical testing then takes place before the support is diced into single chip interposers. If defective parts have been detected during the test, only the good parts are selected for further processing. The chip interposers are then soldered or brazed onto a MLC substrate provided with terminal pads, disposed according to a similar grid.

This alleviates the critical problem under the prior art (of vias and TFR not lining up properly). Vias and TFR are formed more easily if the TFR is formed first, then the vias are formed afterwards by the use of photolithographic techniques.

BRIEF DESCRIPTION OF THE DRAWINGS

In the accompanying drawings, forming a material part of the disclosure.

DESCRIPTION OF THE PREFERRED EMBODIMENTS

Figure 1:
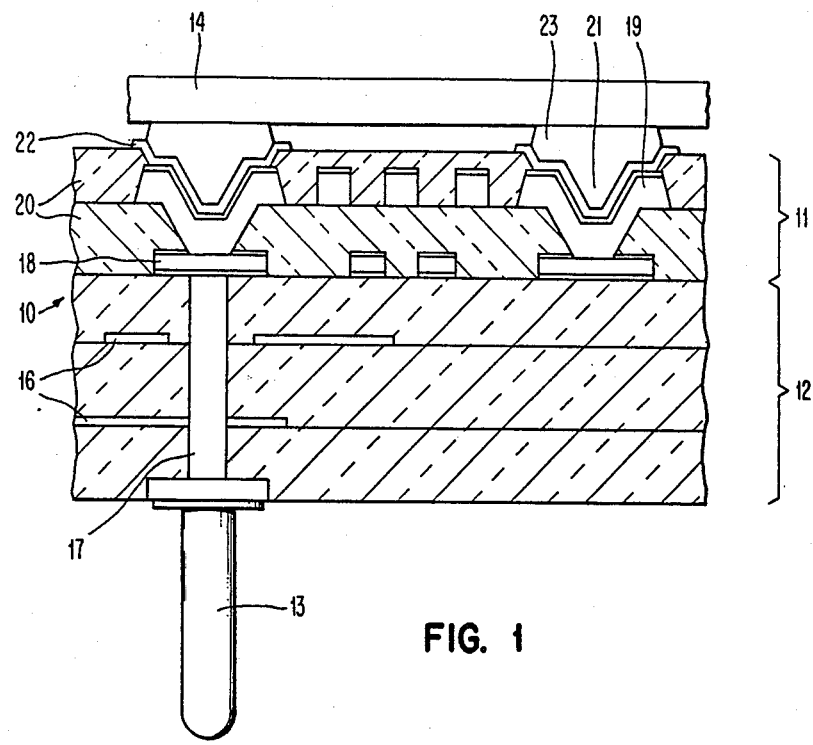
FIG. 1 is a partial cross-sectional view of a known semiconductor device package including a TFR structure formed onto a MLC substrate with a semiconductor chip mounted on it.
Figure 2:
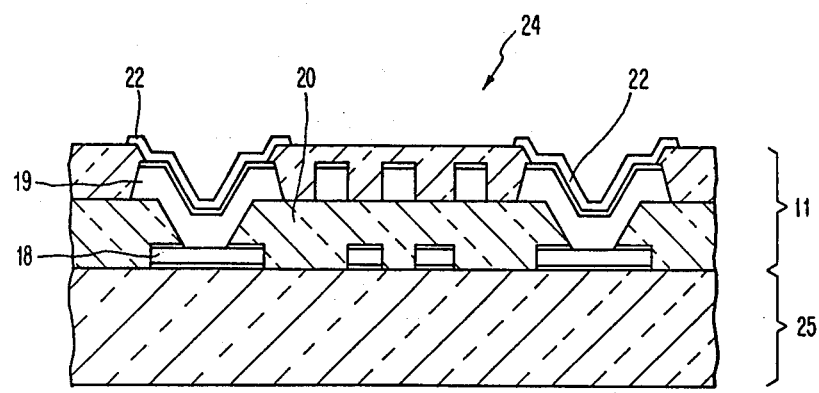
FIGS. 2 through 8 are schematic partial cross sections of a multichip interposer comprised of a TFR structure formed onto a ceramic sheet, undergoing a step by step fabrication, in accordance with the teachings of the present invention.
Figure 3:
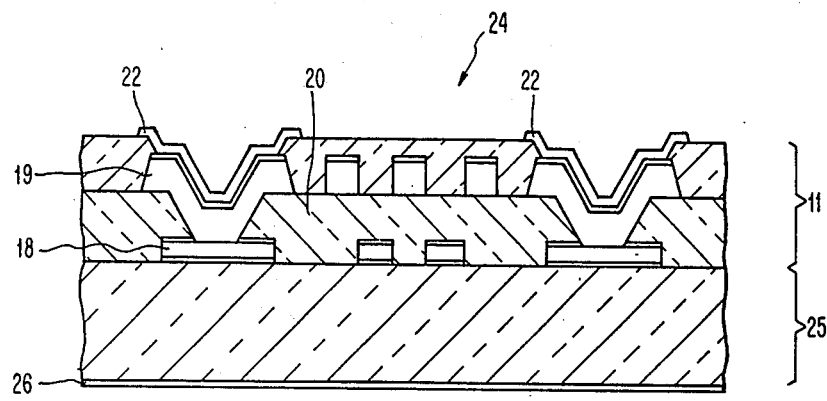

FIG. 2 shows a partial cross sectional view of a multichip interposer 24 comprised of a TFR structure 11 formed onto an insulating support 25. Although the invention will be illustrated with a standard TFR structure such as the one detailed with regards to FIG. 1 (and therefore having the same numerals), it is to be understood that reference is given to a TFR structure as an example; any thin film fine line metallization such as metallurgy 18 formed a the surface of the insulating support would be appropriate as well. According to the teaching of the present invention, said insulating support is a blank sheet of ceramic material, including both ceramics and glass ceramics, in the range of approximately 0.1 mm to 3 mm. In this particular application, glass ceramic, of about 1 mm thickness has been chosen, since its coefficient of expansion more closely matches that of silicon, but the invention is not limited to glass ceramics. Other materials could also be used, provided that they can be etched, preferably by Reactive Ion Etching (RIE) techniques or with laser assisted chemical etching. It is a great advantage to be able to use a blank unprocessed support which is flat and smooth, as a starting material to form a TFR structure as compared to prior techniques in which the TFR structure is formed on a heavily processed, non-flat and irregularly shrunk MLC substrate. As seen in FIG. 3, a layer of a masking material 26 is formed onto the backside. Any material which adheres well to the ceramic substrate and does allow selective etching of the substrate may be selected, for example, chromium or aluminum. In the present application, a thin well adhering metal layer, for example, a chromium film of at least 200 nm thick is evaporated on the whole backside surface. The chrome metal is selected because of its superior adhesion to both ceramic and glass substrates (chromium is also the bottom layer of the first level metallurgy 18 in the TFR structure).

Figure 4:
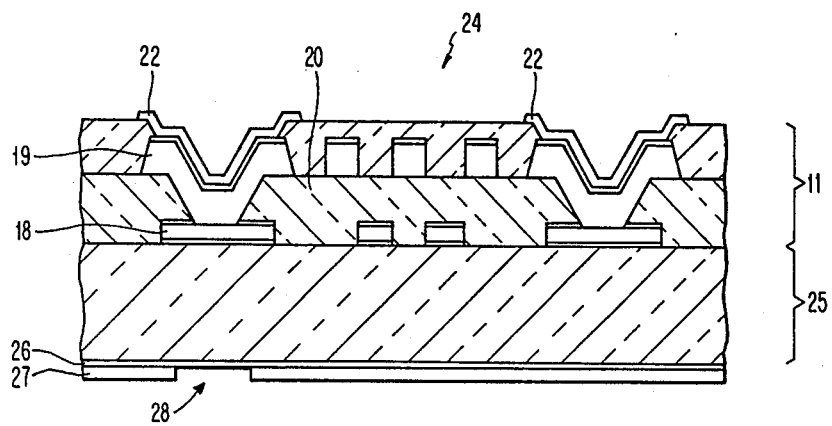

As seen in FIG. 4 a layer 27 of a photoresist, e.g., AZ1350J a product manufactured by A. Z. Shipley having 1-2 microns thickness, is applied to coat the chromium layer. According to standard photolithographic step, the photoresist layer is exposed through a mask (not represented) and developed. It leaves the chromium exposed in the areas 28 where the via holes or vias are to be formed.

Figure 5:
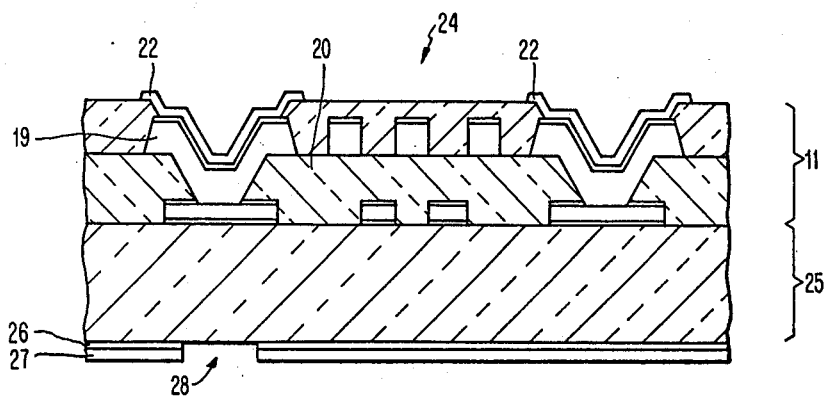

The exposed chromium areas are then etched preferably according to dry etch techniques. For example, chromium may be etched in a Reactive Ion Etching equipment in a chlorinated plasma, such as $CCl_4$-Argon or $CCl_4$—$N_2$ (i.e., 50%-50%) plasma at a pressure of approximately 20 microns and a power density of approximately 1 W/$cm^2$. The resulting structure is shown in FIG. 5.

As a variant, the via pattern in the chromium may be achieved by direct etching (the photoresist mask 27 is not used any longer), with an Excimer laser using chlorine, through a standard chromium on quartz projection mask.

Figure 6:
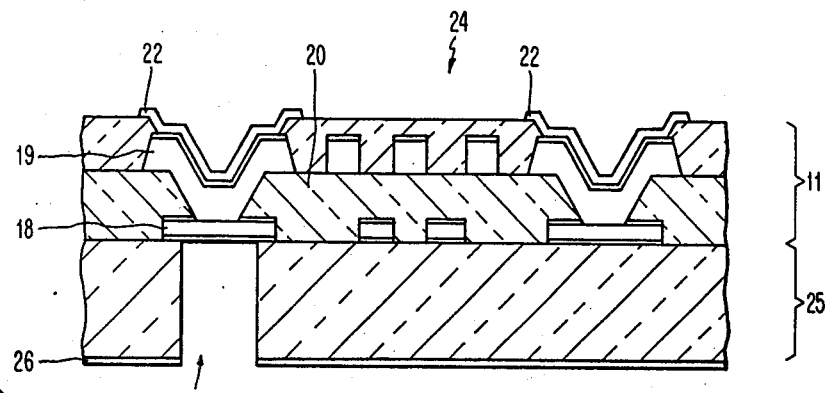

Now turning to FIG. 6, which illustrates the key step of the presented invention, the etching of substantially cylindrical via holes 29 through the ceramic support is done until the first level metallization 18 is reached. Via hole diameter is approximately 100 microns.

This etching step may be effected in a fluorinated plasma, such as $CF_4$—$O_2$ (i.e., 90-10%) plasma in a Reactive Ion Etching equipment, at a pressure of approximately 20 microns and a power density of approximately 1 W/$cm^2$. The RIE process finds a natural etch-stop at the surface of the bottom layer of chromium of M1 (layer 18). Alternatively, one can also use high pressure plasma etching, for instance, at 1 Torr and 4 W/$cm^2$ in a suitable high pressure plasma reactor.

Figure 7:
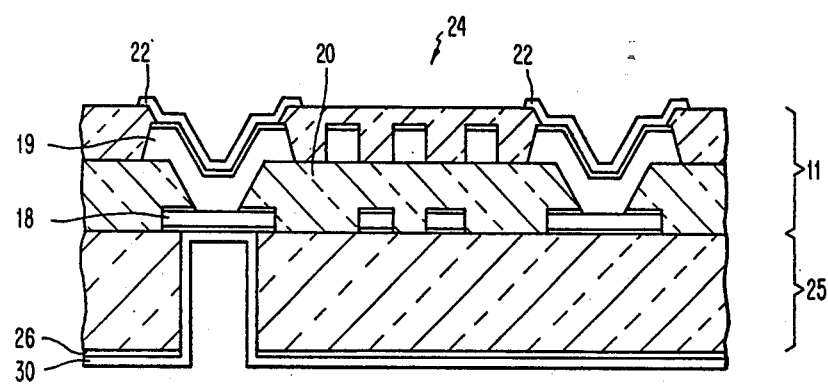

As seen in FIG. 7, an interconnecting metallurgy is blanket deposited over the whole back surface of the support, including the interior of via holes to form a continuous layer 30, whereby an electrical connection is made between said first level of metallization of the top side of the support and the backside.

The preferred metal is copper because of its high conductivity. Copper is deposited by sputtering with a thickness of approximately 1 micron which permits the coating of horizontal portions and vertical portions as well. Copper reaches into the via holes and has demonstrated excellent coverage and adhesion.

Figure 8:
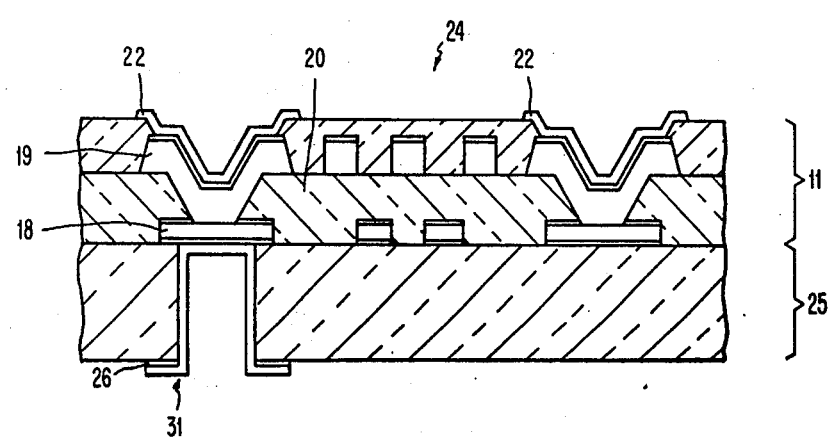

FIG. 8 shows the structure after removal of excess copper and chromium using photolithographic steps. Due to the presence of relatively deep via holes, use of standard photo-resist application techniques cannot be properly used. Thus, a film of a photosensitive polymer such as Riston (a trademark of DuPont de Nemours) taped on as a mask, is recommended for this step (not represented). The removal of these metals can be completed either using wet processes ($FeCl_3$ for Cu and $KMnO_4$ for Cr) or by dry processes, such as laser-assisted copper and chrome etching in $Cl_2$. As seen from FIG. 8, the metal remains around each via hole as an eyelet-shaped contact pad 31 of copper with an underlying chromium ring to improve its adhesion as explained above. Oblong shaped pads may also be designed as well.

As a variant, after opening 28 (FIG. 5) has been completed in the chromium layer, laser induced chemical etching may be used to etch via holes 29 (FIG. 6) in the ceramic body using a reactive gas (i.e., sublimed $XeF_2$) as an etchant gas. A halogen ambient may also be suitable.

A range of operating conditions are:
Pressure: greater than approximately 0.5 Torr
Laser: approximately 10.6 micron $CO_2$
Pulse Rate: machine dependent (10-1000 HZ)
Peak Power: greater than approximately 1 Joule/pulse In another embodiment using laser activated chemical etching techniques, vias can be etched directly, (i.e., without using masking techniques), on the backside of the ceramic support depicted in FIG. 2, by projecting the desired via pattern directly with a Nd:YAG or a $CO_2$ laser (the latter being preferred due to its higher etch rates) and reacting the material with $XeF_2$ gas. Chrome and copper are then sputter deposited, and excess metal etched away leaving metal eyelets around vias as described above. The resulting structure is still similar to FIG. 8 except there is an underlying Cr film inside the vias as well. Laser processing conditions are the same as described above with their respective type of lasers, either Nd:YAG or $CO_2$.

Figure 9:
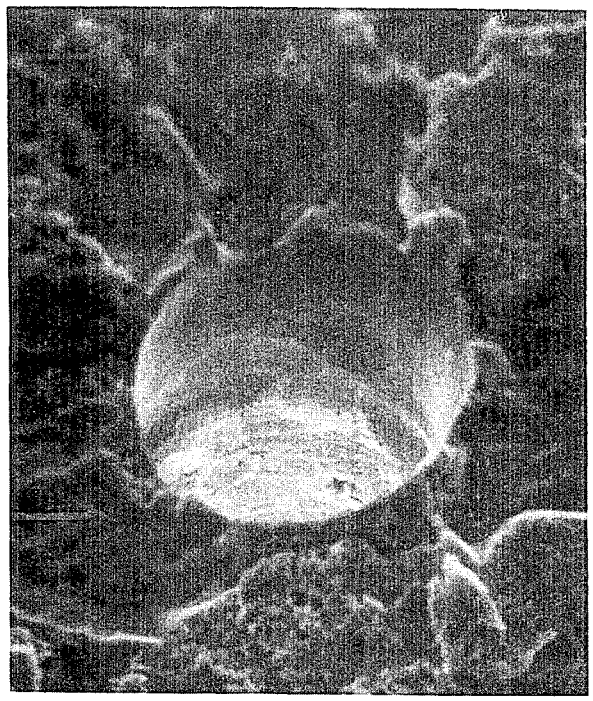
FIG. 9 is a microphotograph showing a substantially cylindrical hole etched by a laser through a ceramic sheet.

FIG. 9 is a microphotograph showing a via hole etched in a ceramic support according to said above direct laser etching techniques, which evidences the sharp definition and the smoothness of the sidewalls. There is no noticeable cratering which is usually seen in non-chemical-assisted laser etching.

Figure 10A:
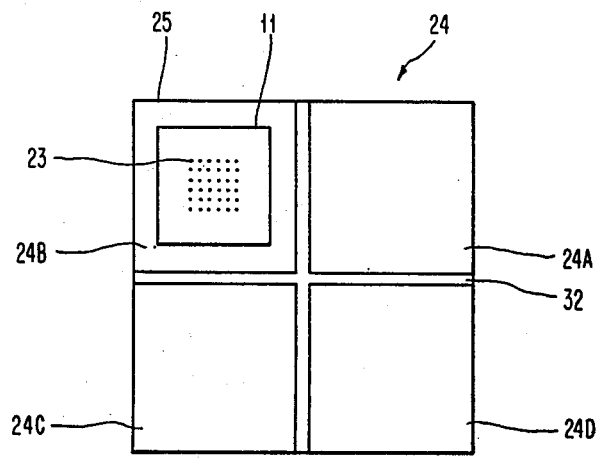
FIGS. 10A and 10B show top and bottom views respectively of a multichip interposer made in accordance with the present invention.
Figure 10B:
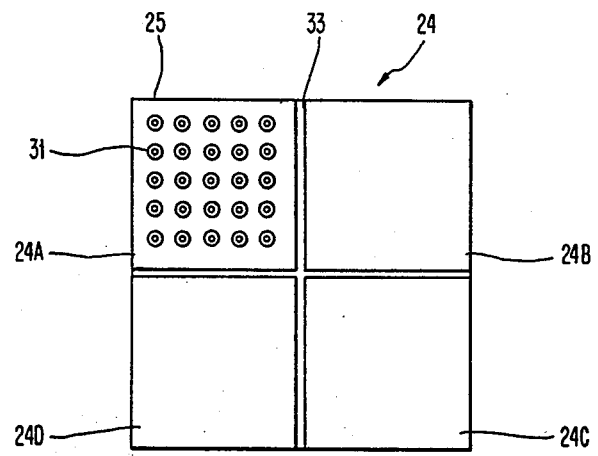

The multichip interposer 24 is now completed. FIGS. 10A and 10B show respectively schematic top and bottom views of such an interposer for 4 semiconductor chips.

All dimensions are photolithographically defined and compatible with large scale production. As mentioned before, there is no concern about shrinkage tolerances. As the technology progresses, larger and larger multichip interposers can be fabricated according to the teachings of the present invention, without having to be concerned about the control of dimensional tolerances.

The multichip interposer 24 is now tested for functionality and electrical integrity. Electrical testing by probing large areas (before dicing) is simple, since all of the chip positions are exactly in the proper locations.

The multichip interposer is now diced into a plurality of single chip interposers referenced 24A to 24D in FIGS. 10A and 10B. Any known method may be used to scribe the interposer into different parts. However, a convenient manner is hereafter explained, using laser etching and plasma etching techniques for dicing. The individual chip carriers can be completely separated in one step after electrical testing, or alternatively, the ceramic can be partially etched prior to electrical testing, and separated into individual chip carriers after electrical testing. The good parts as resulting from the test operation are selected for further processing.

Figure 11A:
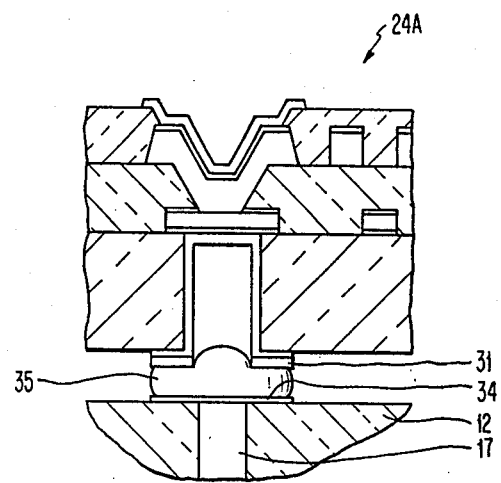
FIGS. 11A and 11B illustrate different ways to attach a multichip interposer to a bare MLC substrate.
Figure 11B:
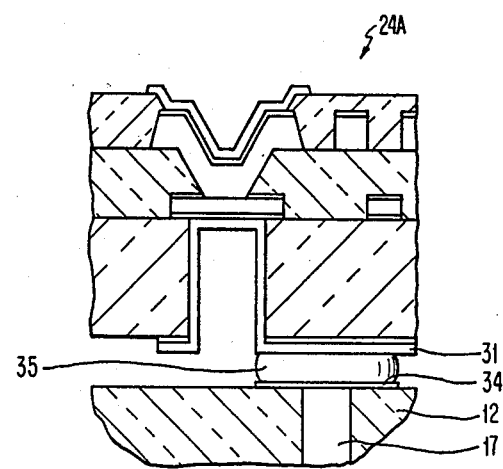

The bonding of a single chip interposer such as 24A to a substrate such as a MLC substrate will be now described by reference to FIGS. 11A and 11B. Although a standard bare ceramic substrate with metal filled via holes would be appropriate, it is preferable first to deposit an additional metallurgy atop said via holes.

An appropriate metallurgy is molybdenum-nickel-gold: Mo/Ni/Au. Contact pads 31 on the interposer are bonded to said metallic islands 34 by brazing or using a solder 35. Attachment may be done either by aligning the pads and islands (such as represented in FIG. 11A), or by offsetting them (such as represented in FIG. 11B).

Figure 12:
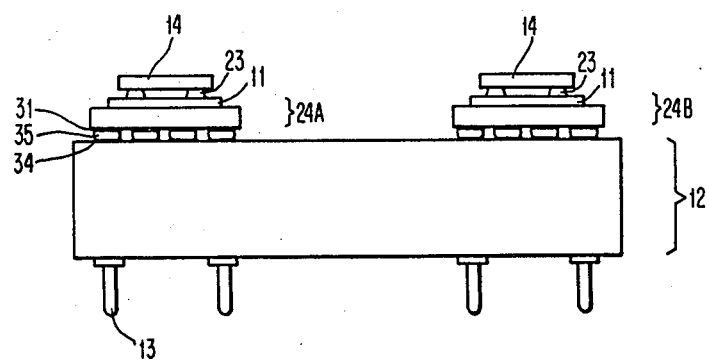
FIG. 12 shows a schematic view of a bare MLC substrate upon which a pair of single chip interposers, obtained after dicing and sorting of said multichip interposer, are mounted, each carrying a VLSI semiconductor chip.

FIG. 12 shows a partial cross sectional view of a MLC substrate 12 upon which a pair of single chip interposers 24A, 24B are mounted each carrying a VLSI semiconductor chip. Although not shown, well known solder reflow techniques are employed to bond the chip solder pads to their respective chip land pattern on the interposer, such as described in U.S. Pat. Nos. 3,374,110 and 3,429,949 assigned to the same assignee as the present invention.

While there has been shown and described what is considered at present to be the preferred embodiment of the present invention, it will be appreciated by those skilled in the art that modifications of such embodiment may be made. It is, therefore desired that the invention not be limited to this embodiment, and it is intended to cover in the appended claims all such modifications as fall within the true spirit and scope of the invention.

What is claimed is:

1. A method of fabricating an interposer for connecting a plurality of semiconductor chips to a substrate, comprising, in sequence, the steps of:
    providing an insulating support having a thin film fine line metallization formed on its top surface before the top surface is interrupted by holes interfering with fine line photolithography,
    depositing a layer of masking material adhering well to the support onto the bottom side of said support,
    removing said masking material according to a desired pattern, so as to expose areas of the support where via holes are to be formed,
    etching the exposed areas of the support until reaching said metallization, whereby via holes are created through the suppport,
    depositing an interconnecting metallurgy on the backside of the support including the interior of said via holes, whereby an electrical connection is made between said thin film fine line metallization on the top side and the bottom side of said support, and
    forming a contact pad around each via hole.

2. The method of claim 1 wherein said insulating support comprises a sheet of continuous ceramic in the range of about 0.1 mm to 3 mm thickness.

3. The method of claim 2 wherein said masking material is selected from the group consisting of chromium and aluminum, at least approximately 200 nm thick.

4. The method of claim 3 wherein the step of delineating said masking material further includes the step of:
    depositing, exposing and developing a layer of photoresist material according to said desired pattern.

5. The method of claim 4 wherein the step of etching chromium is effected in a chlorinated plasma atmosphere in reactive ion etch equipment.

6. The method of claim 3 wherein the step of etching said masking material is effected by direct etching with an Excimer laser in a chlorine atmosphere.

7. The method of claim 5 wherein the step of etching the exposed areas of the ceramic support is effected in a fluorinated plasma in reactive ion etching equipment at pressures of less than approximately 100 microns, and a power density greater than approximately 0.1 W/cm$^2$.

8. The method of claim 5 wherein the step of etching the exposed areas of the ceramic support is effected in a fluorinated plasma in reactive ion etching equipment, at a pressure greater than approximately 500 microns and a power density greater than approximately 2 W/CM$^2$.

9. The method of claim 5 wherein the step of etching the vias of the ceramic support is effected by laser induced chemical etching in a reactive gas ambient.

10. The method of claims 7 or 8 or 9 wherein said thin film fine line metallization comprises a Cr-Cu-Cr metallurgy.

11. The method of claim 10, further including the steps of:
    (a) testing the functionality of the interposer at each chip site;
    (b) dicing said interposer into a plurality of single chip interposers, each corresponding to a chip site; and
    (c) selecting good single chip interposers.

12. The method of claim 11 further including the steps of:
    (a) providing a multi-layered ceramic substrate having molybdenum filled via holes, each terminated on the upper surface by a terminal pad, said terminal pads being disposed according to a grid which roughly corresponds to the grid of said contact pads of the interposer,
    (b) registering and bonding at least one single chip interposer to said multi-layered ceramic substrate by either soldering or brazing said contact pads to corresponding terminal pads on the substrate.

13. The method of claim 12 wherein said terminal pad comprises a Mo/Ni/Au combination.

14. The method of claims 1 or 5 or 6 wherein the step of removing said masking material includes the steps of:
    using an ultraviolet sensitive polymer film layer as a block out mask,
    exposing and developing said ultraviolet sensitive polymer film layer, and
    etching said masking material.

15. The method of claim 14 wherein said pads around the via holes are ring shaped or oblong.

16. The method of claim 6 wherein the step of etching the exposed areas of the support is effected in a fluorinated plasma in reactive ion etching equipment at pressures of less than approximately 100 microns, and a power density greater than approximately 0.1 W/cm$^2$.

17. The method of claim 6 wherein the step of etching the exposed areas of the support is effected in a fluorinated plasma in reactive ion etching equipment at a pressure greater than approximately 500 microns and a power density greater than approximately 2 W/cm$^2$.

18. The method of claim 3 wherein the step of etching the exposed areas of the support is effected by laser induced chemical etching in a reactive gas ambient.

19. The method of claims 16 or 17 or 18 wherein said thin film fine line metallization is a Cr-Cu-Cr metallurgy.

20. The method of claim 19 further including the steps of:
    (a) testing the functionality of the interposer at each chip site;
    (b) dicing said interposer into a plurality of single chip interposers, each corresponding to a chip site; and
    (c) selecting good single chip interposers.

21. The method of claim 20 further including the steps of:
    (a) providing a multi-layered ceramic substrate having molybdenum filled via holes, each terminated on the upper surface by a terminal pad, said terminal pads being disposed according to a grid which roughly corresponds to the grid of said contact pads of the interposer, (b) registering and bonding at least one single chip interposer to said multi-layered ceramic substrate by either soldering or brazing said contact pads to corresponding terminal pads on the substrate.

22. The method of claim 21 wherein said terminal pad comprises a Mo/Ni/Au combination.

23. A method of fabricating an interposer for connecting a plurality of semiconductor chips to substrate comprising in sequence, the steps of:

providing an insulating support having a thin film line metallization formed atop of it before the top surface thereof is interrupted by holes interfering with fine line photolithography;

direct etching of via holes on the backside of said insulating supoort by projecting the desired via pattern directly with a laser in the presence of a reactive gas ambient until reaching said metallization, depositing an interconnecting metallurgy on the backside of the support, including the interior of said via holes, whereby an electrical connection is made between said thin film fine line metallization on the top side and the bottom side of said support, and forming a contact pad around each via hole.

24. The method of claim 23 wherein said insulating support comprises a sheet of continuous ceramic in the range of about 0.1 mm thickness to 3 mm thickness.

25. The method of claim 23 wherein the step of depositing includes the step of sputtering a composite layer formed by an underlying layer of chromium and overlying layer of copper.

26. The method of claim 25 wherein said thin film fine line metallization comprises a Cr-Cu-Cr metallurgy.

27. The method of claim 25 or 26 further including the steps of:

(a) testing the functionality of the interposer at each chips site;

(b) dicing said interposer into a plurality of single chip interposers each corresponding to a chip site and, (c) selecting good single chip interposers.

28. The method of claim 27 further including the steps of:

(a) providing a multi-layered ceramic substrate having molybdenum filled via holes each terminated on the upper surface by a terminal pad, said terminal pads being disposed according to a grid which roughly corresponds to the grid of said contact pads on said interposer;

(b) registering and bonding at least one single chip interposer to said multi-layered ceramic substrate by either soldering or brazing said contact pads to their corresponding terminal pads on the substrate.

29. The method of claim 28 wherein said terminal pad comprises a Mo/Ni/Au combination.

* * * * *